(12) United States Patent
Boegli et al.

(10) Patent No.: US 10,083,253 B2
(45) Date of Patent: Sep. 25, 2018

(54) METHOD FOR PRODUCING A SET OF COOPERATING EMBOSSING ROLLERS

(71) Applicant: BOEGLI-GRAVURES S.A., Marin-Epagnier (CH)

(72) Inventors: Charles Boegli, Marin-Epagnier (CH); Werner Steffen, Stans (CH)

(73) Assignee: Boegli-Gravures S.A., Marin-Epagnier (CH)

( * ) Notice: Subject to any disclaimer, the term of this patent is extended or adjusted under 35 U.S.C. 154(b) by 678 days.

(21) Appl. No.: 14/429,538

(22) PCT Filed: Sep. 13, 2013

(86) PCT No.: PCT/IB2013/058527
§ 371 (c)(1),
(2) Date: Mar. 19, 2015

(87) PCT Pub. No.: WO2014/045176
PCT Pub. Date: Mar. 27, 2014

(65) Prior Publication Data
US 2015/0234940 A1 Aug. 20, 2015

(30) Foreign Application Priority Data
Sep. 20, 2012 (EP) .................................. 12185236

(51) Int. Cl.
*G06F 17/50* (2006.01)
*B44B 5/02* (2006.01)

(52) U.S. Cl.
CPC ............... *G06F 17/50* (2013.01); *B44B 5/02* (2013.01)

(58) Field of Classification Search
CPC ............... G06F 17/50; Y10T 29/4956; Y10T 29/49565; Y10T 29/49544; B21B 27/055;
(Continued)

(56) References Cited

U.S. PATENT DOCUMENTS 3,902,114 A * 8/1975 Alich ...................... B21B 38/10
324/207.12
3,921,514 A * 11/1975 Biondetti ................ B21B 13/02
100/162 B
(Continued)

FOREIGN PATENT DOCUMENTS

EP 0 924 058 A1 6/1999
GB 1 570 821 7/1980
(Continued)

OTHER PUBLICATIONS

Wasmann, Udo. "Measurement and analysis of static deformations in machine tools", 8008 TM Technisches Messen, vol. 63, No. 2, Feb. 1996, 8 pgs.
(Continued)

*Primary Examiner* — Jason L Vaughan
(74) *Attorney, Agent, or Firm* — Foley & Lardner LLP (57) ABSTRACT

In the method for producing a set of cooperating embossing rollers, a modelling device is used for parameterizing the embossing rollers, the device comprising a test bench having a pair of rollers which are put under hydraulic pressure that can be measured and set, in order to determine from the measurement data the parameters for producing the embossing rollers. The use of a modelling device for obtaining the parameters for producing a set of embossing rollers makes it possible to use a very large variety of embossing patterns and foils with diverse properties as a basis and, by conducting tests on this very test bench, be able to efficiently narrow down and predetermine the properties of a final embossing device, preferably operated without hydraulics.

11 Claims, 9 Drawing Sheets

(58) Field of Classification Search
CPC ......... B21B 37/34; B21B 37/36; B21B 38/10; B21B 38/105; B44B 5/02
USPC .......... 492/28, 30, 31, 33, 34, 35, 36, 37, 2
See application file for complete search history.

(56) References Cited

U.S. PATENT DOCUMENTS

| | | | | |
|---|---|---|---|---|
| 4,000,242 | A * | 12/1976 | Hartbauer | B31F 1/07 100/163 R |
| 4,023,480 | A * | 5/1977 | Biondetti | B21B 37/36 100/162 B |
| 4,074,624 | A * | 2/1978 | Biornstad | B21B 37/36 100/170 |
| 4,106,405 | A * | 8/1978 | Biondetti | B21B 37/36 100/162 B |
| 4,154,160 | A * | 5/1979 | Kusters | D21G 1/002 100/162 B |
| 4,222,324 | A * | 9/1980 | Biondetti | B21B 37/36 100/162 B |
| 4,502,312 | A * | 3/1985 | Marchioro | B21B 37/36 100/162 B |
| 4,597,326 | A * | 7/1986 | Kultaranta | D21G 1/002 100/162 B |
| 4,644,860 | A * | 2/1987 | Brendel | D21G 1/002 100/162 B |
| 4,972,232 | A * | 11/1990 | Hoover | G03G 15/2064 219/216 |
| 5,007,271 | A | 4/1991 | Boegli | |
| 5,109,767 | A * | 5/1992 | Nyfeler | B21H 8/005 101/228 |
| 5,560,237 | A * | 10/1996 | Yasuda | B21B 13/145 72/13.4 |
| 5,598,774 | A * | 2/1997 | Boegli | B21B 31/02 100/170 |
| 5,662,574 | A * | 9/1997 | Slotten | B29C 43/46 100/168 |
| 5,813,959 | A * | 9/1998 | Hader | B21B 27/055 492/16 |
| 6,158,260 | A * | 12/2000 | Ginzburg | B21B 37/28 72/11.7 |
| 6,338,262 | B1 * | 1/2002 | Donini | B21B 37/28 72/11.7 |
| 6,370,961 | B1 * | 4/2002 | Trantzas | G01L 5/0085 73/824 |
| 7,480,995 | B2 * | 1/2009 | Adami | B31F 1/2863 29/895 |
| 7,662,078 | B2 * | 2/2010 | Bomba | D21G 1/022 492/10 |
| 7,681,627 | B2 * | 3/2010 | Schmitz | B22C 7/02 164/35 |
| 7,823,428 | B1 * | 11/2010 | Malik | B21B 37/28 72/7.1 |
| 8,050,792 | B2 * | 11/2011 | Bergsten | B21B 37/28 700/154 |
| 8,600,714 | B2 * | 12/2013 | Russell | G06F 17/5018 703/6 |
| 8,600,715 | B2 * | 12/2013 | Russell | G05B 13/04 703/6 |
| 8,660,829 | B2 * | 2/2014 | Russell | G06F 17/5018 703/6 |
| 8,660,830 | B2 * | 2/2014 | Russell | G05B 17/02 703/6 |
| 8,670,965 | B2 * | 3/2014 | Russell | G05B 17/02 703/6 |
| 8,825,457 | B2 * | 9/2014 | Gummalla | G06F 17/5018 703/6 |
| 8,939,009 | B2 * | 1/2015 | Seidel | B21B 38/105 73/1.79 |
| 9,073,282 | B2 * | 7/2015 | Wegele | B65H 20/02 |
| 2005/0199141 | A1 * | 9/2005 | Uglow | B31F 1/07 101/22 |
| 2007/0015648 | A1 | 1/2007 | Biagiotti et al. | |

FOREIGN PATENT DOCUMENTS

| | | |
|---|---|---|
| RU | 2368504 C1 | 9/2009 |
| RU | 2410175 C2 | 1/2011 |
| SU | 1740090 A1 | 6/1992 |
| WO | WO 00/69622 | 11/2000 |
| WO | WO 02/076716 A1 | 11/2002 |

OTHER PUBLICATIONS

International Search Report and Written Opinion dated Feb. 28, 2014 in PCT/IB2013/058527 (13 pgs.).
First Office Action dated Nov. 28, 2016 in related Chinese Appl. 201380048977.4 with English-language translation (17 pgs.).
Office Action dated Aug. 2, 2017 in related Russian Appl. No. 2015112669/02(019874) with English-language translation (10 pgs.).

* cited by examiner

METHOD FOR PRODUCING A SET OF COOPERATING EMBOSSING ROLLERS

CROSS REFERENCE TO RELATED APPLICATIONS

This application is a national stage entry of PCT/IB2013/058527, filed Sep. 13, 2013; which claims priority to European application no. 12185236.2, filed Sep. 20, 2012. The disclosures of both prior applications are hereby incorporated by reference in their entirety.

The present invention relates to a method for producing a set of cooperating embossing rollers for a device for embossing packaging materials. Packaging foils for the tobacco industry or for the foodstuff industry have been embossed with embossing roller devices for some time, which can be for example so-called inner liners, which are wrapped about a number of cigarettes or chocolate material for chocolate, butter or similar foodstuff, electronic components, jewelry or watches.

Since approximately 1980, following the application of U.S. Pat. No. 5,007,271 of the same applicant, steel rollers have been increasingly used mainly in the tobacco industry, which are equipped with a very large number of small teeth, as a result of which on the one hand a matt appearance of the metal foils which are shiny in the normal state was achieved and on the other hand conditioning of the foil in order to simply further processing. By entirely or partially removing teeth, the so-called logos are created, which can also show different optical effects. During the course of the improvement of the methods for producing rollers, the teeth, or their distances from one another, became ever smaller and the surface of the teeth is likewise processed in order to for example create authentification features or also colour patterns through interference.

By even further improved production methods, for example by means of laser, embossing rollers can also be produced which do not have any teeth but merely elevations and depressions in order to create the desired logos. At the same time, the use of metallised and coated foils starting out from pure metal foils was adopted, wherein the metal component became ever smaller in order to be totally omitted in the latest development. However, because of this, the entire packaging process with foils became more difficult, in particular the folding and packaging process following the embossing and the logo structures became ever finer. This brings about a major increase of the pressure of the two cooperating embossing rollers.

In addition to the visual appearance by applying decorative structures, logos, etc. on foils, the mechanical characteristics are likewise influenced via the embossing process, especially the tendency of not being able to maintain the desired folding angle following the mechanical folding. By embossing, this effect of the foil can be clearly reduced, which increases the machine runability of the foil and thus reduces the produced waste during the packaging (see for example WO 00/69622 A1 and WO 2002/076716). The tendency of further reducing the metallic component in the choice of the materials has a negative effect on the folding characteristics since pure metallic foil does not show any folding back (e.g. pure, unbroken paper in comparison with this knows opening of the folding angle). Increasing requirements in terms of the finesse of visual effects additionally require ever finer structures. These two problems, the material selection (accompanied by the folding characteristics) and the increased requirements in terms of the areal density of structures to be embossed (e.g. lines per linear cm), can be solved with increased embossing pressure.

As a consequence of increasing the embossing pressure and reducing the distance between the embossing roller provided with logos and the counter-roller, the embossing roller with the logos in particular is mechanically deformed in such a manner that even embossing can no longer be ensured, in particular where very fine structures on the embossing roller are concerned.

With increasing areal density of the embossing structures (e.g. 800 lines per linear cm), ever more possible visual effects open up which for example can be utilised for the decoration. However, the artefacts which are created by defects during the production increase accordingly and consequently for example inhomogeneous embossing. Users are afraid of embossing pressures which are locally overly excessive, which can create holes in the embossing material. Homogeneous embossing pressure in the embossing region between the embossing rollers is therefore indispensable. In the case of embossing pressures of adequate strength, embossing rollers however exhibit mechanical deflection and deformation of the roller body, which renders the required homogeneous pressure distribution impossible. With larger roller diameters, this can be counteracted. A diameter enlargement is easily conceivable technically speaking, but application-based reasons frequently speak against this. An example is a fixed unwinding length with packaging products, which requires a fixed circumference of the roller.

Here it is assumed that generally the counter-roller has a larger circumference than the embossing roller. The reason for this is that the diameter of the embossing roller, i.e. of the particular roller on which the logos for example are located, often has to have a diameter that is defined by the application. In order to avoid deflection with this roller, there are different technical approaches. Further support rollers provided behind the embossing roller would be conceivable. The principle here is the distribution of the forces acting on the embossing roller over further rollers provided behind the embossing roller.

A further interesting approach towards solving this object is the crowning of one of the rollers, preferably of the counter-roller. Since the diameter of said counter-roller is subject to the least application requirements, its diameter, compared with the drive roller, can be selected sufficiently large so that it is not affected by any deflection under pressure compared with the drive roller. Under the embossing pressure that is required for the correct (i.e. aesthetically correct) embossing result, the embossing roller (logo roller) then follows the crowning of the counter-roller and a homogenous force distribution is created.

Crowned rollers offer the advantage that the construction of the embossing head or of the roller housing remains simple. For such roller systems according to the invention, the same simple roller housing can always be used. No (support) rollers have to be employed, which does not overcomplicate and/or hugely increase the cost of the technical realisation. This approach chosen by the inventor however has not been realised to date according to our knowledge since among other things attempts were made to directly calculate the correct roller curvature with the help of material data, which failed. The empirical method for determining the crowning found by the inventor allows the exact production of rollers for the high-quality, finest embossing of all thin foils.

In principle it is possible for each foil condition and embossing type to measure the deflection of the embossing roller with the help of samples and directly carry out a material-specific mechanical offsetting of the effect of the deflection, but such a method is too expensive and involved for the production of a large number of rollers with a large variety of embossing patterns and foils.

In the case of the method selected by the inventor, rollers of different crowning have to be produced for each foil type, each foil condition, each engraving type and each embossing print so that by evaluating the embossing result the necessary embossing force can be derived from the crowning. It must be noted especially that a roller pair, wherein one of the rollers has a crown, only has a homogeneous force distribution in the embossing gap with a fixed pressure, i.e. can only be employed with this one embossing pressure.

Starting out from this, the object of the present invention is to state a method for producing a set of cooperating embossing rollers, which makes possible a largely complete offsetting of the effect of the embossing roller, wherein among other things the type and structure of the surface of the embossing roller, the thickness and the condition of the foil and starting out from this the embossing pressure between the two rollers are taken into account. This object is solved according to the method described below, wherein for the purpose of determining the parameters that are necessary for producing the set of embossing roller a modelling device (roller stand), also simply called stand in the following, is used. By constructing and employing this stand, the subsequent use of purely mechanical, crowned rollers can be modelled. Further objects and advantages are obtained from the dependent claims and the following description.

In the following, the invention is explained in more detail with the help of drawings of exemplary embodiments.

In order to be able to produce the definitive set of for example crowned embossing rollers, their parameters, especially the crowning, are determined according to the invention by means of a modelling device, of a test stand. Here, the effect of the deflection of the for example crowned embossing roller is offset by the geometry of the counter-roller in such a manner that the thicker, for example crowned, counter-roller is given a deformed surface predetermined by the modelling device, which determines the deflection of the embossing roller.

In order to predetermine the final geometry of the (counter) roller (the crowning) as described above, a test embossing stand is introduced here. This device to be produced in a few pieces at the roller manufacturer is technically significantly more complex than a combination of a crowned and of a non-crowned roller, hence not intended for the production, but offers the possibility for example of testing different embossing pressures under homogeneous embossing pressure distributions during the embossing by tuning the hydraulic pressure.

Figure 1:
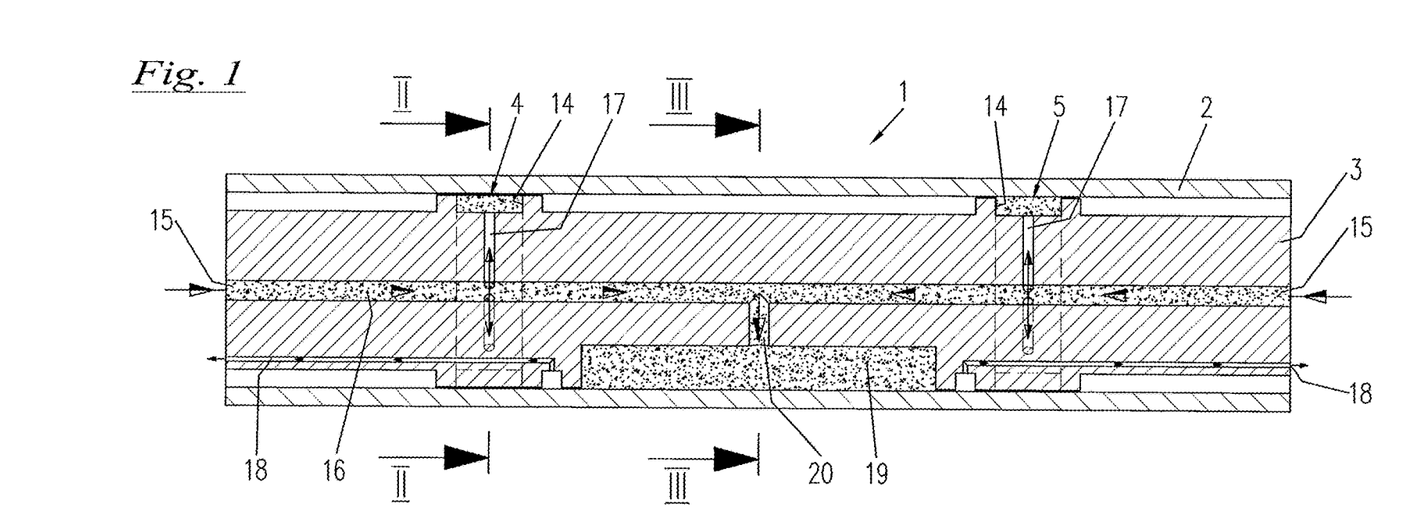
FIG. 1 shows in longitudinal section a roller of a modelling device.

FIG. 1 shows a longitudinal section through a hydrostatically mounted roller 1 of a modelling device, wherein this roller 1 comprises a shell 2 and an axle 3. In order to keep the deformation of the axle under pressure as low as possible, the same is produced from hard metal. The axle is held on two bearing regions 4 and 5 in the shell, while the hydrostatic roller is only partly shown. The axle in this case has to be embodied from hard metal since an axle made of steel would be excessively deflected under the force that occurs.

The surface of the shell 2 is provided with logos 27 (see FIGS. 6 and 7), which can be equal to those that are applied to the embossing roller employed in the final product, or sample logos, which can be exemplary for a series of logos.

The purpose of this roller arrangement is to put the roller axle under a certain hydraulic pressure in order to be able to measure the deflection of the same. Here it must be noted that a roller alone cannot be put under hydraulic pressure without causing deformations and damages and that the entire measurement system can only be operated in the configuration of FIG. 6. Here, the deflection of the axle can be derived from the physical parameters of the hard metal and the applied hydrostatic pressure.

In order to generate hydrostatic pressure, four segments 6, 7, 8 and 9 are arranged in the two bearing regions 4 and 5 each on a bearing part of the axle, wherein each segment comprises an intermediate web 10, as a result of which four bearing pockets 11, 12, 13 and 14 are created between the axle segments and the shell. The hydraulic pressure medium, for example oil, enters a continuous pipe 16 from an inlet 15 and is distributed in the bearing region via four channels 17 between the segments and enters the bearing pockets. The return 18 on both sides is likewise drawn in.

FIG. 1 furthermore shows that the two bearing regions 4 and 5 are embodied mirror-inverted. From FIG. 2 it is evident that upon hydraulic pressure built-up a symmetrical pressure loading takes place, so that the axle and the shell are held coaxially. Upon deflection from the centre position, a resetting force is created.

If now a strong force is exerted from the outside via the axle, e.g. via its suspension, i.e. a pressure force in the direction of a counter-roller, the bearings can pass on this force in the bearing regions only to a limited extent since these have a symmetrical arrangement. The maximum pressure force of the rollers that can be achieved would be limited and not homogeneous in the region between the bearings, the actual embossing region.

For this reason, a further sectorial pressure pocket 19 that is not symmetrically arranged to the cross section of the axle is provided. Said pressure pocket 19 is likewise subjected to hydrostatic pressure by the oil pipe 16 via the feed line 20. The pressure pocket allows directing the pressure forces exerted onto the axle from the outside via the shell to the counter-roller 21 and thus to the embossing edge PK between the rollers.

This means that in the static operating state of the machine, of the stand, the external force and the force passed on to the pressure pocket are just equal. Since the axle mechanically passes on this force a deflection of the axle occurs. The pressure force applied to the two ends of the axle from the outside, e.g. via hydrostatic cylinder is thus passed on into the bearings and the pressure pocket via the axle.

Figure 2:
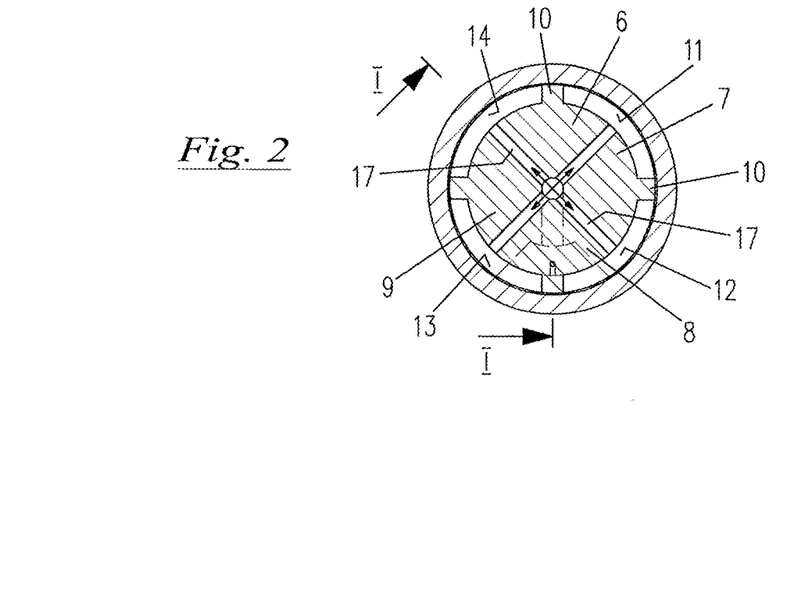
FIG. 2 shows a section according to the line II/II in FIG. 1.
Figure 3:
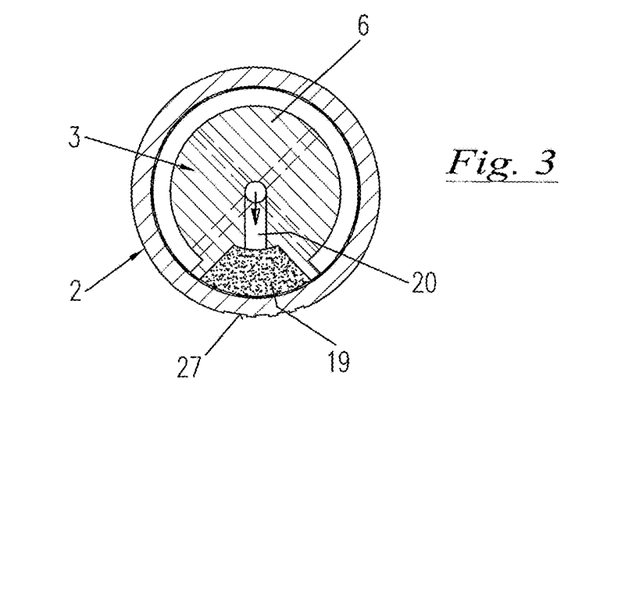
FIG. 3 shows a section according to the line in FIG. 1.
Figures 4A, 4B, 4C:
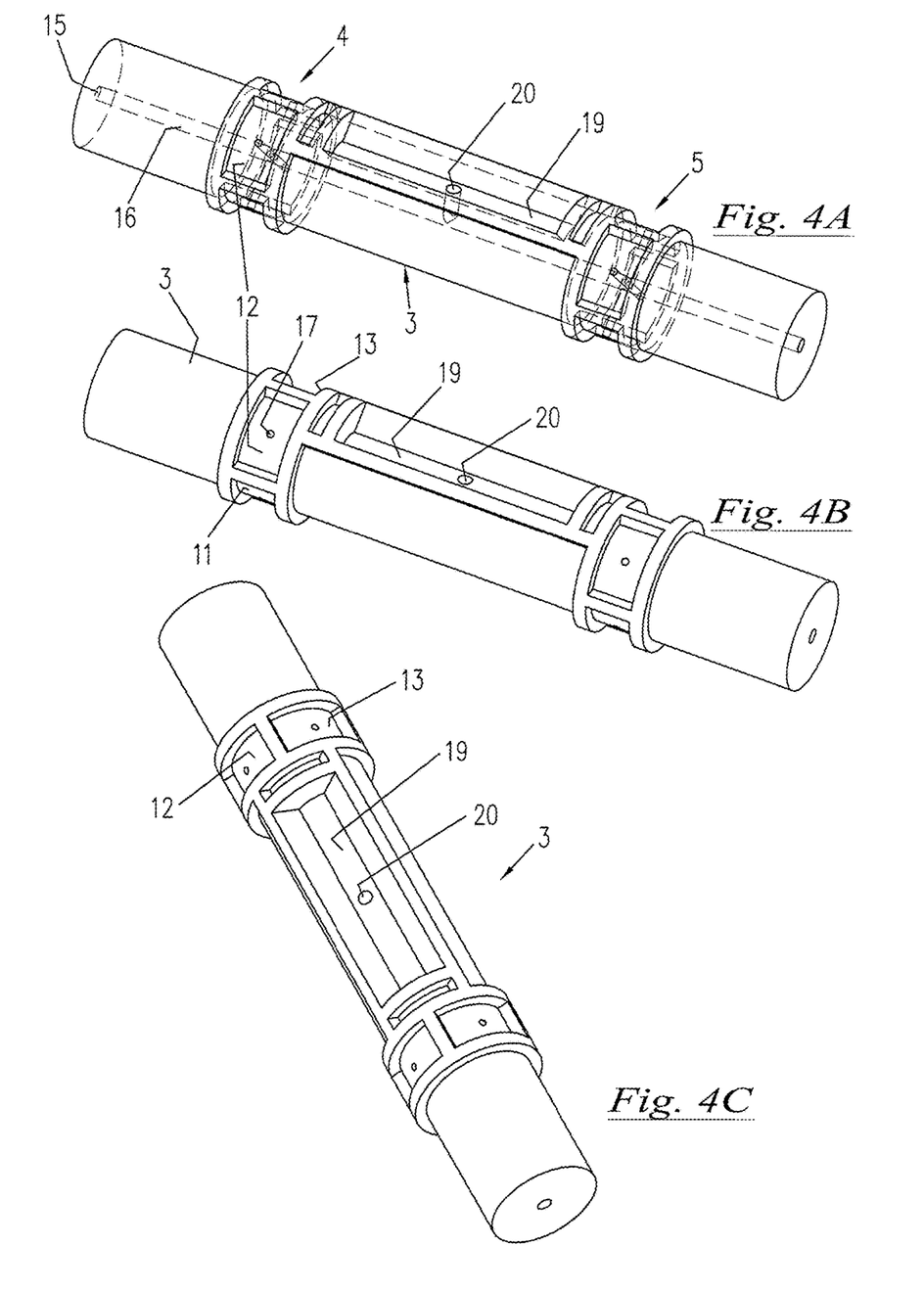
FIG. 4A shows the roller according to FIG. 1 in a perspective view.
FIG. 4B shows the roller according to FIG. 1 in a second perspective view.
FIG. 4C shows the roller according to FIG. 1 in a third perspective view.

FIGS. 4A, B, C show three different perspective views of the axle 3, wherein the view in each case is directed at the pressure pocket. In these views the position of the elements drawn in FIGS. 1, 2 and 3 is evident.

Figure 5:
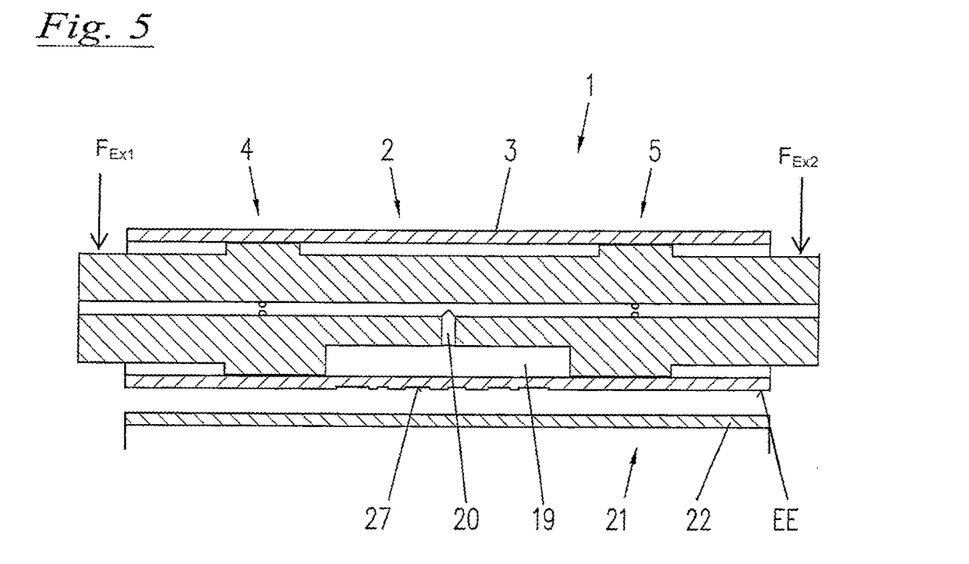
FIG. 5 shows a part of one of the rollers from FIG. 1 prior to being subjected to pressure, e.g. hydraulic pressure.

In FIG. 5, one of the rollers 1 of the modelling device is drawn in, as it presents itself prior to the pressure loading with hydraulic pressure. An external force that is symmetrically arranged on both axle ends acts on the axle from the outside. This force constitutes the external pressure force that is to be employed during the respective embossing. Of the second roller 21, merely the shell 22 is shown and of shell 2 of the first roller, the embossing edge EE, which always comes to lie opposite the counter-roller 21.

Figure 6:
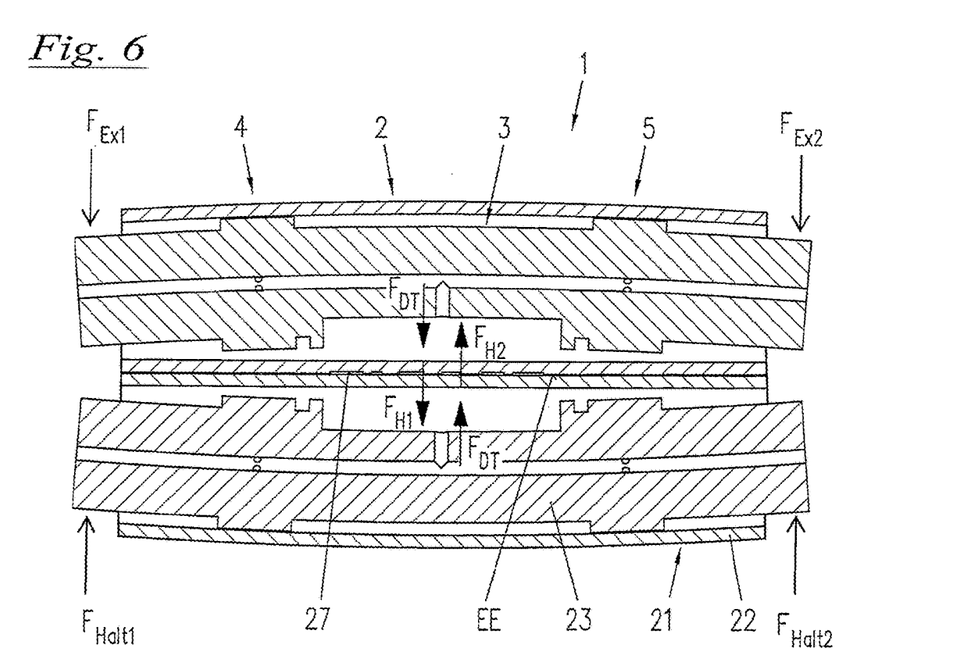
FIG. 6 shows both rollers of the modelling device under hydraulic pressure.

In FIG. 6, both rollers of the modelling device are shown as they are being deformed under pressure loading with the hydraulic pressure of the stand. The two rollers are constructed mirror-symmetrically to the embossing edge EE and because of this a mirror-symmetrical force distribution is created. Drawn in are the forces which are created upon external pressure loading with hydraulic pressure, which act on one of the rollers, in this case roller 1. These are marked with $F_{EX1}$ and $F_{EX2}$ and correspond to the external force/the external pressure on the embossing rollers.

This external pressure is absorbed by the mounting and creates a counter-pressure $F_{Halt1}$ and $F_{Halt2}$. The two external forces can be absorbed at the end of the axles and then supported by the housing at one of the two rollers, at the other axle by for example hydraulic cylinders.

In order to mount the axles in the shell and in order to offset and measure the external pressure on the rollers, a hydraulic pressure system is required which in this case operates with hydraulic oil. This hydraulic oil is directed via the feed line 15 to the bearing pockets and the pressure pocket. The use of hydraulic cylinders for generating the external pressure force offers the advantage that calculating the actually acting forces via the known piston area of the hydraulic cylinders of the stand and a pressure measurement can be easily realised.

On the embossing edge EE between the two rollers in the location of the two pressure pockets, mirror-inverted forces $F_{H1}$, $F_{H2}$ occur. For this reason, the embossing edge remains absolutely straight with external pressure. The mirror-inverted forces on the rollers via the pressure pockets correspond to the embossing pressure and are absorbed by the deflection of the axles. From this arises the objective of these measurements and calculations, the determination of the necessary forces on the embossing edge in order to achieve a good embossing quality, i.e. a qualitatively adequate reproduction of the structures the embossing roller possesses on the embossed material to a dimension and extent that the visual effects on the embossing roller are largely reproduced by the embossed material.

Thus, a simple calculation of the force profile is possible and there, where the hydrostatic pressure pocket is below, a homogenous force profile is created along a straight edge. Then, the actual force distribution and thus the necessary embossing force can be inferred from the given hydraulic pressure.

By configuring the modelling device, i.e. of the test stand, i.e. in that the embossing edge is always exactly flat, the calculation of the force ratios can be simplified. From the resulting measurement data, such as offsetting of the deflection of the axles and of the direct measurement of the hydrostatic pressure of the hydraulic medium employed, this deflection can be converted to a purely mechanical axle without hydrostatic system and because of this the configuration or geometrical shape, especially the crowning of the counter-roller. This simple access to the necessary embossing force via the test stand makes possible predicting the geometry (e.g. crowning) of commercially employable embossing devices.

Figure 7:
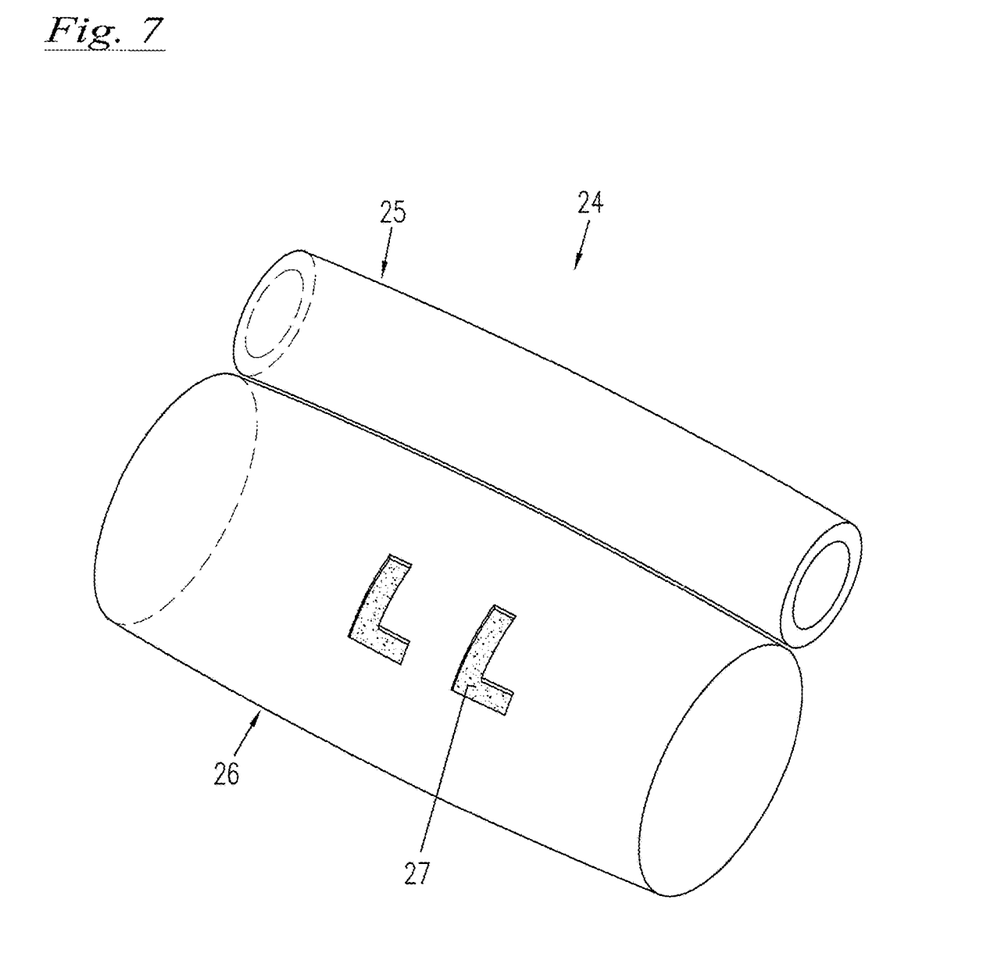
FIG. 7 shows an embossing roller pair produced with data of the modelling device.

In FIG. 7, an embossing roller pair 24 is illustrated in perspective view and purely schematically, with the thinner embossing roller 25 and the backup-roller 26 with larger diameter. On the backup-roller, the logos L are symbolically drawn in (as shown with reference numeral 27), which can have very small structures.

The data of the hydrostatic roller system are calculated and entered as a function of the surface structure of the embossing roller to produce and of the foil to be embossed. Foil runs are the conducted at different external pressures until the desired embossing quality has materialised and the resulting hydrostatic measure is measured. From this hydraulic pressure value, the values for the geometrical shape of the counter-roller can be calculated by means of suitable computational programs. In the present example, the effect of the deflection of the embossing roller is offset by means of a crowning of the counter-roller.

Here it is assumed that through the acting external pressure, i.e. the embossing force, the normally more solid counter-roller is only imperceptibly deformed. In addition, the crowning is calculated in such a manner that the deflection of the embossing roller is predetermined by the crowning, i.e. that the crowning has a tendency to be slightly larger than the deflection of the embossing roller by the embossing pressure alone. Because of the fact that the crowning of the counter-roller determines the deflection of the embossing roller it can be achieved that the gap between the two rollers during the embossing remains constant with a great accuracy.

Instead of four bearing pockets, another number of bearing pockets can also be provided, but the hydraulic pressure on the axle must be symmetrical. In addition to this, more than one pressure pocket can also be provided.

FIGS. 8-12 constitute measurement results which were obtained in tests on an axle in a hydrostatic two-modelling device, with accessibility through direct measurement, partly through numerical simulation. During these tests, both rollers are clamped in a mounting of a housing which is not shown and the hydrostatic pressure is applied to an axle, the shown one, wherein all figures relate to a hydrostatic pressure corresponding to a force of 15,000 Newton (N) and the axle has a length of 225 mm and a circumference of 150 mm.

Figure 8:
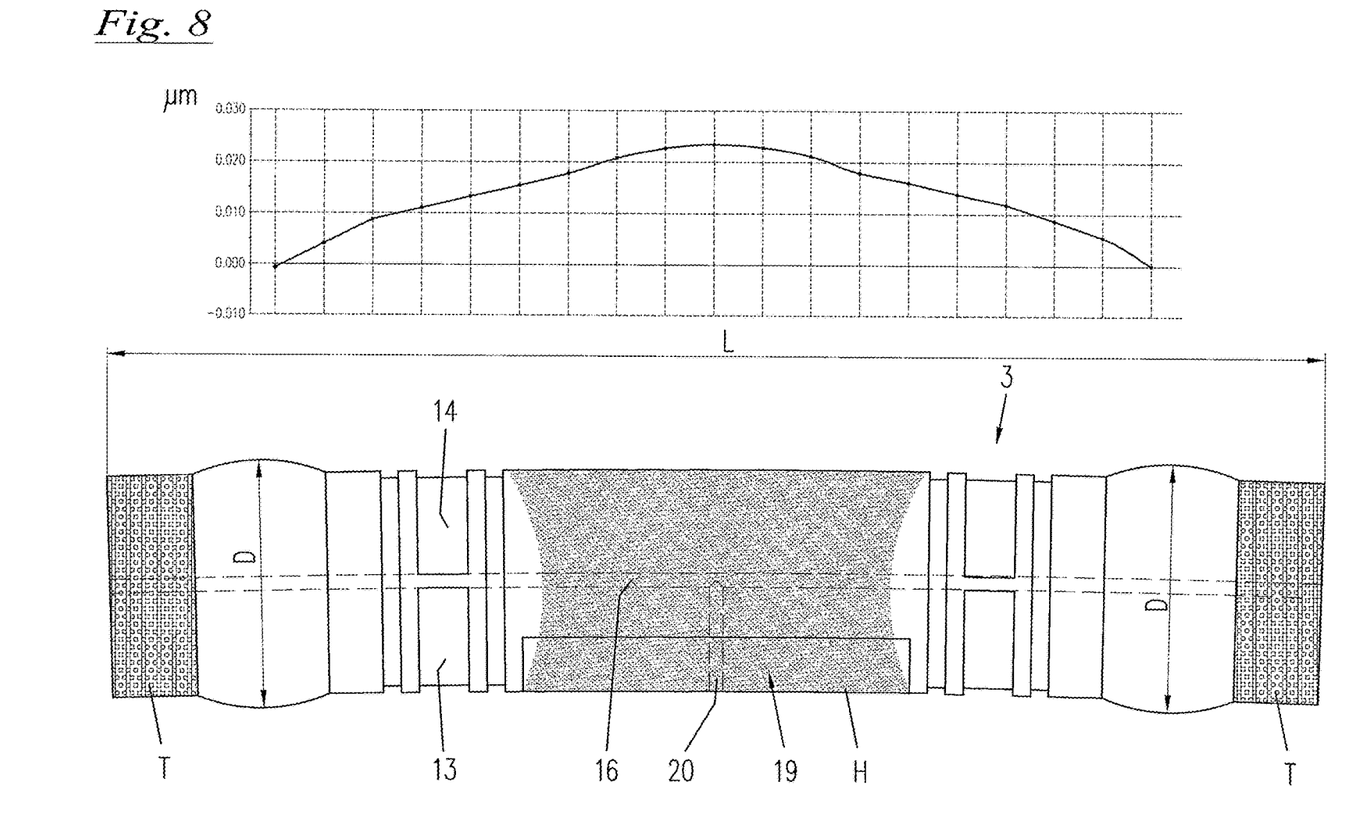
FIG. 8 shows the entire deflection of an axle of a roller of the modelling device under hydraulic pressure.

In FIG. 8, the full deflection of the axle is calculated, wherein according to the diagram a total of approximately 24 μm deflection resulted. These data apply with full hydraulic pressure of the machine of the stand. The dotted region in the middle of the axle corresponds to the increased pressure H and thus deflection. The two outer regions T of the axle shown patterned are neither under pressure nor do they show any deflection, since they are held there.

Figure 9:
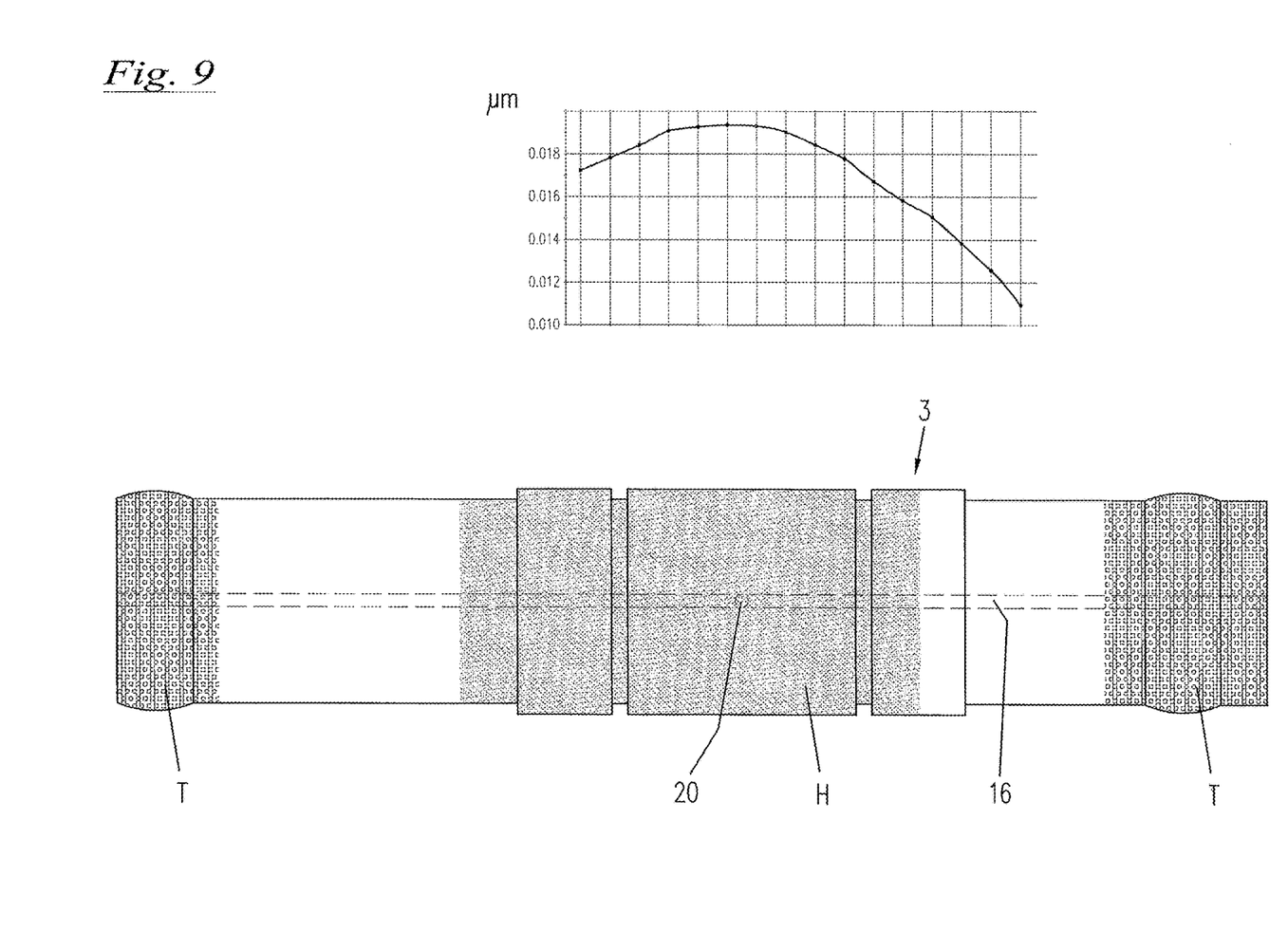
FIG. 9 shows the deflection of the axle according to FIG. 8 in the middle part.

The diagram of FIG. 9 shows a calculation of the deflection of the hard metal axle in the middle of the axle, i.e. above the pressure pocket 19, where a deflection of approximately 8 μm is obtained. A pressure of approximately 100 bar was applied onto the pressure pocket in order to offset the deflection. The dotted region in the middle of the axle symbolises the increased deflection in this region. When using a steel axle, the deflection would be approximately three times as great. The position of the axle is turned in FIG. 9 by 90° relative to the position of FIG. 8.

Figure 10:
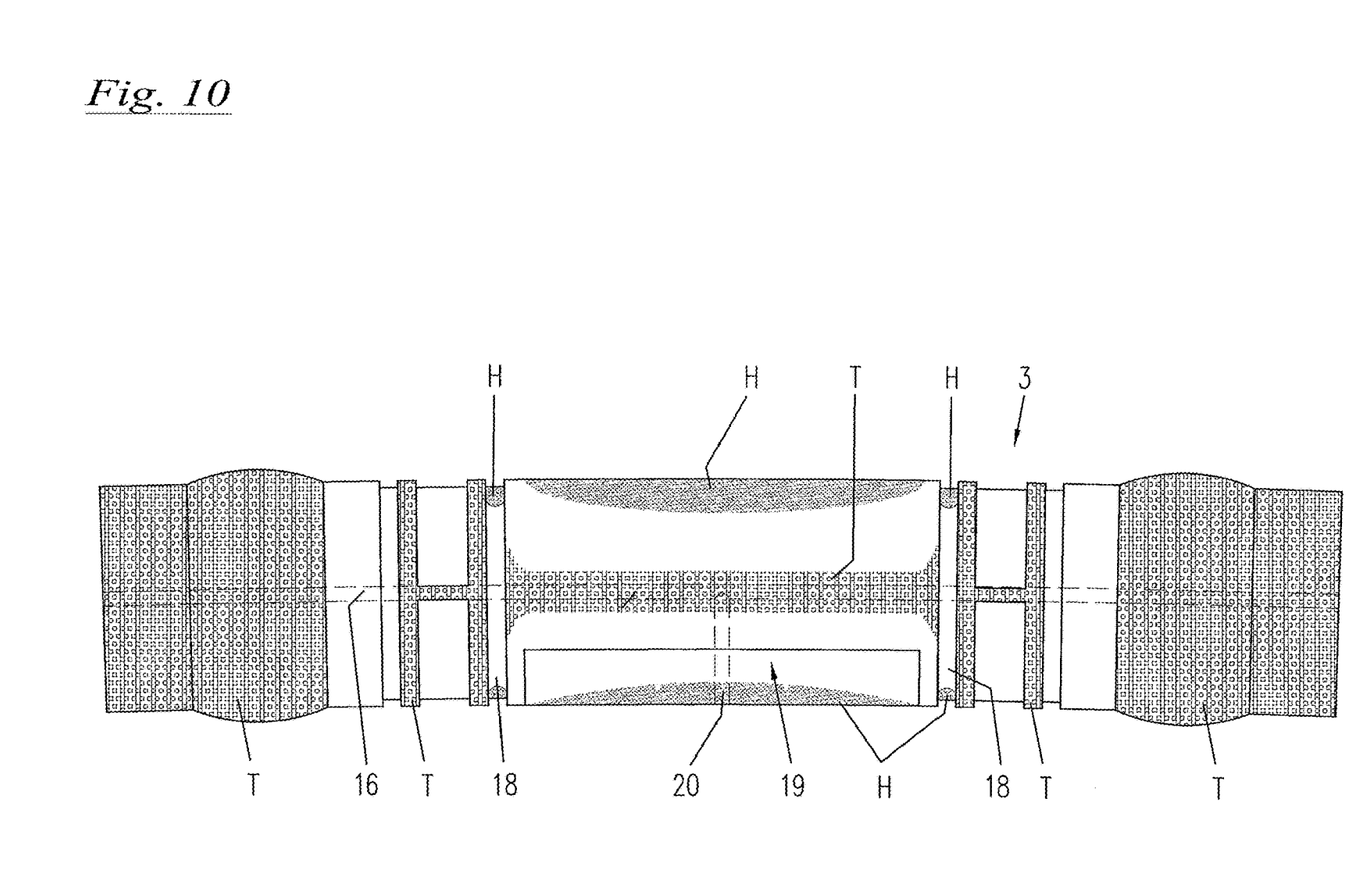
FIG. 10 shows the tension of the axle of FIG. 8 under load.

In FIG. 10, the tension of the axle in the position of FIG. 8 is shown and from this it shows that the tension on the side that is opposite to the pressure pocket is greatest and in the middle region between pressure pocket and the opposite side the tension is very small, as is depicted in the drawing by different patterns.

Figure 11:
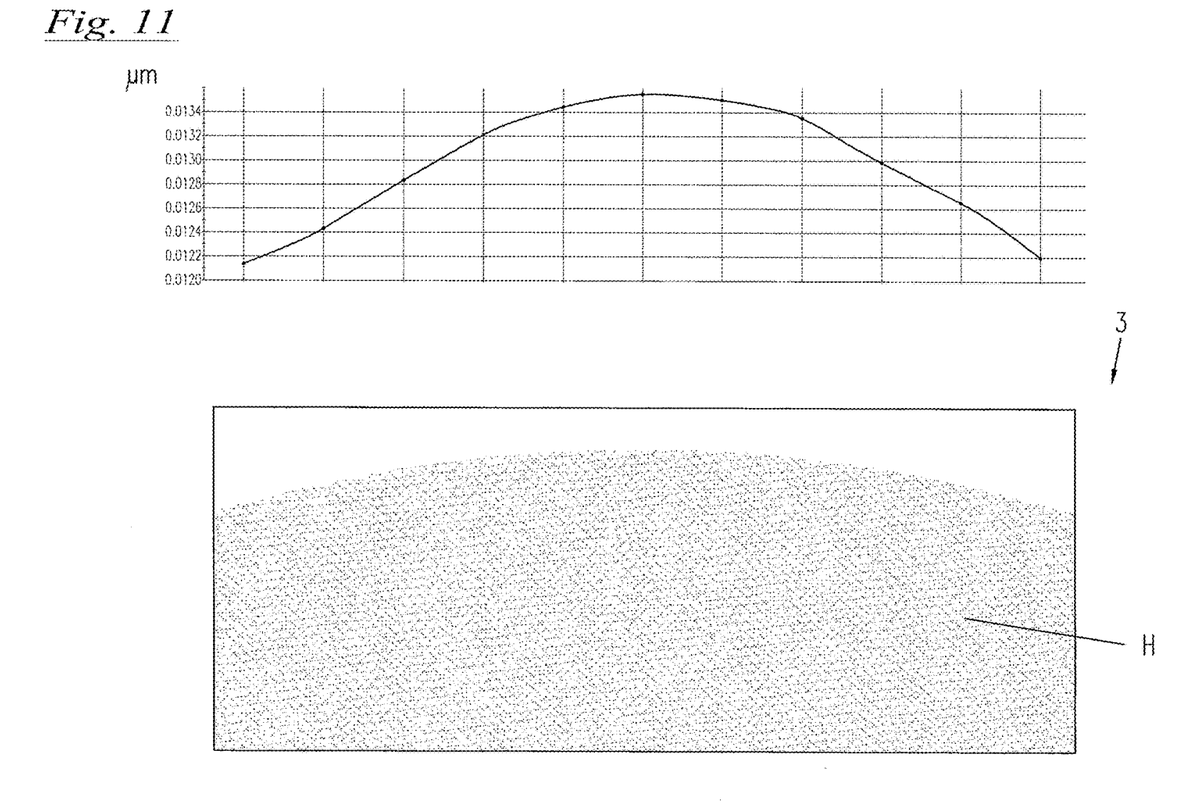
FIG. 11 shows the deformation of the roller on the side located opposite the embossing edge and FIG. 12 shows the deformation of the axle on the embossing edge.

In FIG. 11, the deformation of the axle on the side that is opposite to the pressure pocket is indicated, wherein the pressure pocket side corresponds to the embossing edge, which upon rotation of the roller in each case is created in the place located opposite the counter-roller and where the foil is passed through. From the pattern H a relatively large deformation is visible which however does not reach the limit loading of the shell anywhere, so that material failure cannot occur. In the present case, the formation reaches approximately 14 μm.

Figure 12:
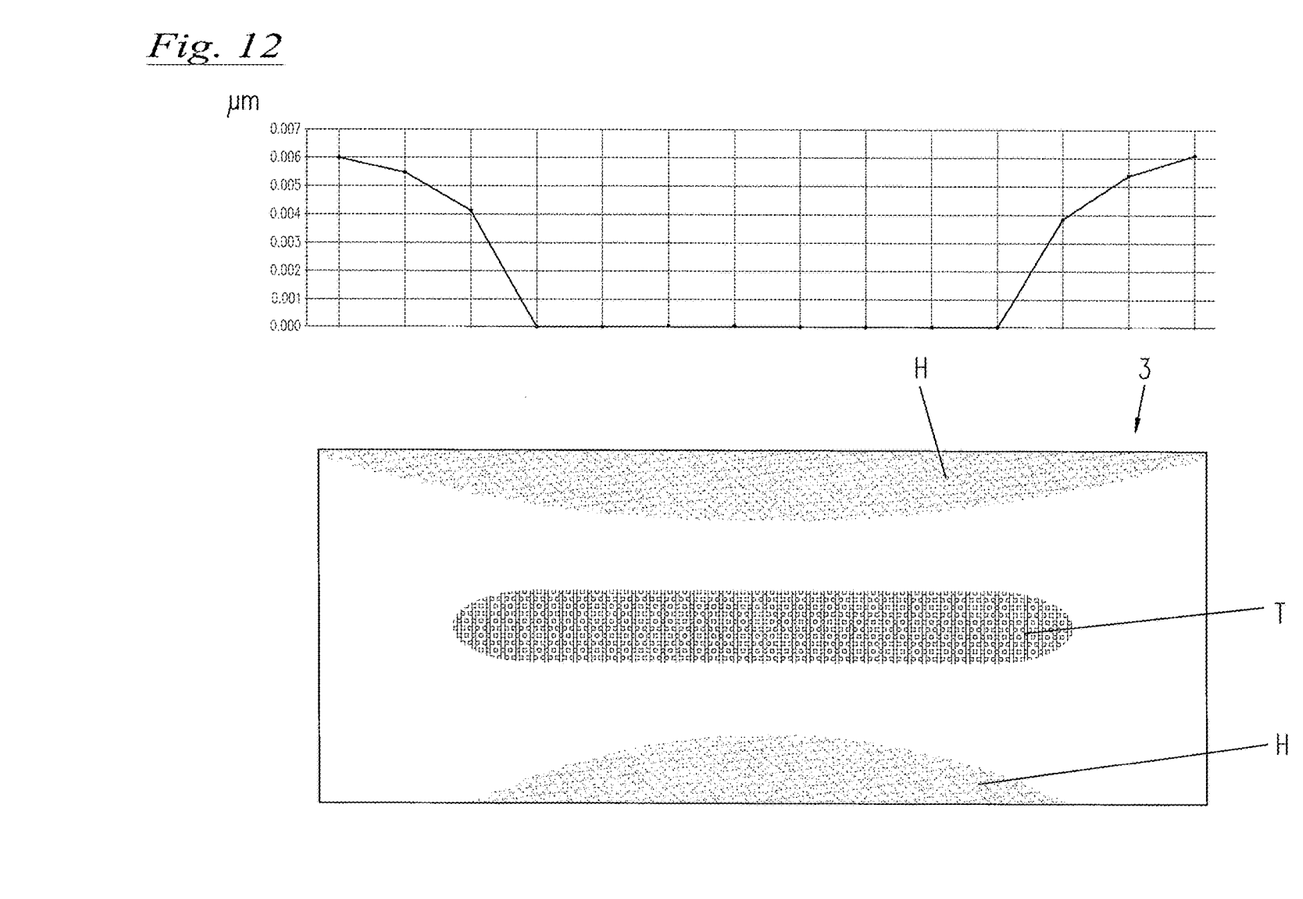

In FIG. 12, the deformation of the roller on the embossing edge is shown, wherein the same hydraulic pressure as in FIG. 11 was used and from which it results that on the embossing edge as a consequence of the pressure pocket and the fact that this embossing edge is opposed by a second roller with identical data, no deflection takes place.

From the preceding figures and the description it is evident that with the described modelling device with two hydrostatically mounted rollers with hard metal axles and pressure pockets it is possible by adjusting the hydraulic pressure, which acts both on the bearing pockets and the pressure pockets, to calculate the respective deflection of the axle. The optimal contact pressure is adjusted through tests with a pattern corresponding to the embossing roller and the foil used and the hydraulic counter-pressure in the bearing pockets and the pressure pocket measured. From these data of the stand, the parameters for the geometry of the embossing and counter-roller of the commercial embossing head later on can be calculated. The evaluation of the quality of the embossing is effected visually by comparing the desired visual effect on the embossing roller and of the result on the aesthetically attractive embossing copy on the foil.

Starting out from the described modelling device it is also conceivable instead of a hydraulic system with oil or compressed air to use another modelling device with pressure pickups or other similar measurement systems and to calculate the loading of the axles and their deflection with the help of other parameters.

Furthermore, another deformation of the embossing rollers and thus of the geometry of the surface of the counter-roller can result. The objective of the entire calculation remains being able to calculate the geometry of the counter-roller corresponding to the embossing roller in the final purely mechanical embossing housing in such a manner that during the embossing of a certain foil and a certain embossing structure even embossing over the entire width of the foil is created even when using very small embossing elements and high embossing pressures.

The use of the test stand described above remains intended to offer the manufacturer of the rollers a device which offers a homogenous force distribution on the embossing edge independently of the applied embossing pressure (e.g. via oil). Accordingly, by comparing the embossing result (on the foil to the embossing structure on the embossing roller the optimal force can be determined which is necessary (since depending on the design the force distribution is always homogeneous this presents itself comparatively simply). Once the necessary embossing pressure has been determined, crowned rollers that are optimised for the embossing effect to be achieved can be produced which then exert the embossing pressure that is needed during the operation in an embossing unit without hydraulics (purely mechanically). The characteristics of the components of this embossing unit, especially the roller geometries are known thanks to the results from the embossing on the test stand and a commercialisable one can be produced with significant cost savings (fewer tests).

LIST OF NUMBERS

1 Hydrostatic roller
2 Shell
3 Axle
4, 5 Bearing regions
6-9 Segment
10 Intermediate webs
11-14 Bearing pockets
15 Inlet oil line
16 Continuous pipe=oil line
17 Channels between the segments
18 Return
19 Pressure pocket
20 Inflow to 19
21 Second roller
22 Shell
23 Axle
24 Embossing roller pair
25 Embossing roller
26 Backup-roller
27 Logos
(DT Pressure on the pressure pocket)
$F_{ex1}$, $F_{ex2}$ External pressure
$F_{Halt1}$, $F_{Halt2}$ Counter-pressure of the mounting
$F_{H1}$, $F_{H2}$ Total pressure on the other roller
EE Embossing edge

The invention claimed is:

1. A method for determining a parameter for a set of cooperating embossing rollers for manufacturing, the method comprising the steps of:
pressurizing a pair of rollers of a modelling device under a measurable and an adjustable pressure for deforming at least one roller of the pair of rollers, the at least one of roller of the pair of rollers having a structure on a surface of a shell thereof;
measuring a deflection of the at least one roller of the pair of rollers during the step of pressurizing; and
determining a parameter related to the structure on the surface of the shell based on the measured deflection, the parameter allowing a geometry of the set of cooperating embossing rollers for manufacturing to be predicted.

2. The method according to claim 1, wherein the step of pressurizing comprises applying a hydraulic pressure with a hydraulic fluid to the pair of rollers via a hydraulic pressure system.

3. The method according to claim 2, wherein the step of measuring the deflection comprises measuring a pressure of the hydraulic fluid to determine the deflection.

4. The method according to claim 1, wherein in the step of determining, the parameter is determined to describe a geometry of a surface of a back-up roller in the set of cooperating embossing rollers.

5. The method according to claim 4, wherein in the step of determining, the geometry of the surface of the back-up roller includes a crown that is selected to be slightly larger than the deflection of the at least one roller caused by the step of pressurizing.

6. The method according to claim 1, wherein the at least one roller of the modelling device includes the shell and an axle, the modelling device further including a housing to which the axle is attached to, and wherein in the step of pressurizing, an external pressure is applied on the axle of the at least one roller of the pair of rollers.

7. The method according to claim 6, further comprising a step of:

measuring a course of a deflection of an axle of the at least one roller deformed in the step of pressurizing.

8. The method according to claim 1, wherein the at least one roller of the modelling device includes the shell and an axle, and wherein the step of pressurizing further includes applying a pressure between the shell and the axle with a hydraulic fluid at a pressure pocket that is arranged in a middle of the axle.

9. The method according to claim 8, wherein during the step of applying the pressure at the pressure pocket, the step of measuring is performed to measure the deflection of the shell along a rotational axis of the at least one roller.

10. The method according to claim 1, wherein the at least one roller of the modelling device includes the shell and an axle, and wherein the step of pressurizing further includes applying a pressure between the shell and the axle with a hydraulic fluid at a plurality of bearing pockets that are arranged circumferentially around the axle.

11. The method according to claim 1, wherein in the step of measuring, a maximal deflection of the at least one roller at a given pressure is determined.

* * * * *